United States Patent
Liu et al.

(10) Patent No.: US 10,348,244 B2
(45) Date of Patent: Jul. 9, 2019

(54) METHOD AND CIRCUIT FOR EXCITING A CRYSTAL OSCILLATION CIRCUIT

(71) Applicant: Beken Corporation, Shanghai (CN)

(72) Inventors: Jiazhou Liu, Shanghai (CN); Yunfeng Zhao, Shanghai (CN); Dawei Guo, Shanghai (CN)

(73) Assignee: Beken Corporation, Shanghai (CN)

( * ) Notice: Subject to any disclaimer, the term of this patent is extended or adjusted under 35 U.S.C. 154(b) by 157 days.

(21) Appl. No.: 15/635,635

(22) Filed: Jun. 28, 2017

(65) Prior Publication Data

US 2018/0337635 A1 Nov. 22, 2018

(30) Foreign Application Priority Data

May 16, 2017 (CN) .......................... 2017 1 0344440

(51) Int. Cl.
  *H03B 5/30* (2006.01)
  *H03B 5/32* (2006.01)

(52) U.S. Cl.
  CPC ............ *H03B 5/30* (2013.01); *H03B 5/32* (2013.01); *H03B 2200/005* (2013.01); *H03B 2200/0008* (2013.01); *H03B 2200/008* (2013.01); *H03B 2200/0012* (2013.01); *H03B 2200/0074* (2013.01); *H03B 2201/0275* (2013.01)

(58) Field of Classification Search
  CPC ........ H03B 5/30; H03B 5/32; H03B 200/005; H03B 200/0074
  See application file for complete search history.

(56) References Cited

U.S. PATENT DOCUMENTS

| | | | | |
|---|---|---|---|---|
| 4,722,070 A | * | 1/1988 | Dye | .......................... G06F 1/12 710/58 |
| 5,694,092 A | * | 12/1997 | Oba | .................... H03B 5/1203 331/117 R |
| 6,366,175 B2 | * | 4/2002 | Oka | ....................... H03L 1/023 331/116 R |
| 9,197,157 B1 | * | 11/2015 | Lin | ......................... H03B 5/36 |

* cited by examiner

*Primary Examiner* — Jeffrey M Shin

(74) *Attorney, Agent, or Firm* — Schwegman Lundberg & Woessner, P.A.

(57) ABSTRACT

A method and a circuit for exciting a crystal oscillation circuit are disclosed herein. The crystal oscillation circuit comprising: charging, with a charging circuit, a voltage-controlled oscillator; providing, with the voltage-controlled oscillator, an exciting signal; blocking, with a direct current blocking capacitor, direct current from the voltage-controlled oscillator to the crystal oscillation circuit; and exciting, with the exciting signal, the crystal oscillation circuit. The circuit for exciting a crystal oscillation circuit, comprising: a charging circuit; a voltage-controlled oscillator coupled to the charging circuit and configured to provide an exciting signal to the crystal oscillation circuit; and a direct current blocking capacitor connected between the voltage-controlled oscillator and the crystal oscillation circuit and configured to block direct current from the voltage-controlled oscillator.

10 Claims, 4 Drawing Sheets

METHOD AND CIRCUIT FOR EXCITING A CRYSTAL OSCILLATION CIRCUIT

CLAIM OF PRIORITY

This application claims priority to Chinese Application number 201710344440.2, entitled "A METHOD AND CIRCUIT FOR EXCITING A CRYSTAL OSCILLATION CIRCUIT," filed on May 16, 2017 by Beken Corporation, which is incorporated herein by reference.

TECHNICAL FIELD

The present application relates to a crystal oscillation circuit and more particularly, but not exclusively, to a method and circuit for exciting the crystal oscillation circuit.

BACKGROUND OF THE INVENTION

In a conventional crystal oscillator circuit, in order to reduce the start-up time for the crystal in the circuit, an additional oscillator may be used as an excitation source. Before the crystal oscillator circuit starts to work, the frequency of the additional oscillator is calibrated to close to the frequency of the crystal oscillator circuit via a calibration circuit. In normal operation, the start-up of the crystal oscillator circuit is relatively fast after being excited by the oscillator.

However, if the excitation oscillator is a free-running oscillator, the frequency cannot change with the environmental temperature changes after the calibration. When temperature change is large, the frequency will deviate from the frequency of the crystal oscillator circuit too much and would not achieve the effect of excitation. Then the excitation oscillator needs to be recalibrated, which will increase the complexity of the circuit design.

As a result, a new method and circuit for exciting the crystal oscillation circuit may be necessary.

BRIEF DESCRIPTION OF THE INVENTION

According to the embodiment of the invention, a method and circuit use a charge circuit with a resistor and a capacitor and a voltage-controlled oscillator to excite a crystal oscillation circuit.

In an embodiment, the method comprises: charging, with a charging circuit, a voltage-controlled oscillator; providing, with the voltage-controlled oscillator, an exciting signal; blocking, with a direct current blocking capacitor, direct current from the voltage-controlled oscillator to the crystal oscillation circuit; and exciting, with the exciting signal, the crystal oscillation circuit.

In another embodiment, the circuit comprises: a charging circuit; a voltage-controlled oscillator coupled to the charging circuit and configured to provide an exciting signal to the crystal oscillation circuit; and a direct current blocking capacitor connected between the voltage-controlled oscillator and the crystal oscillation circuit and configured to block direct current from the voltage-controlled oscillator.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
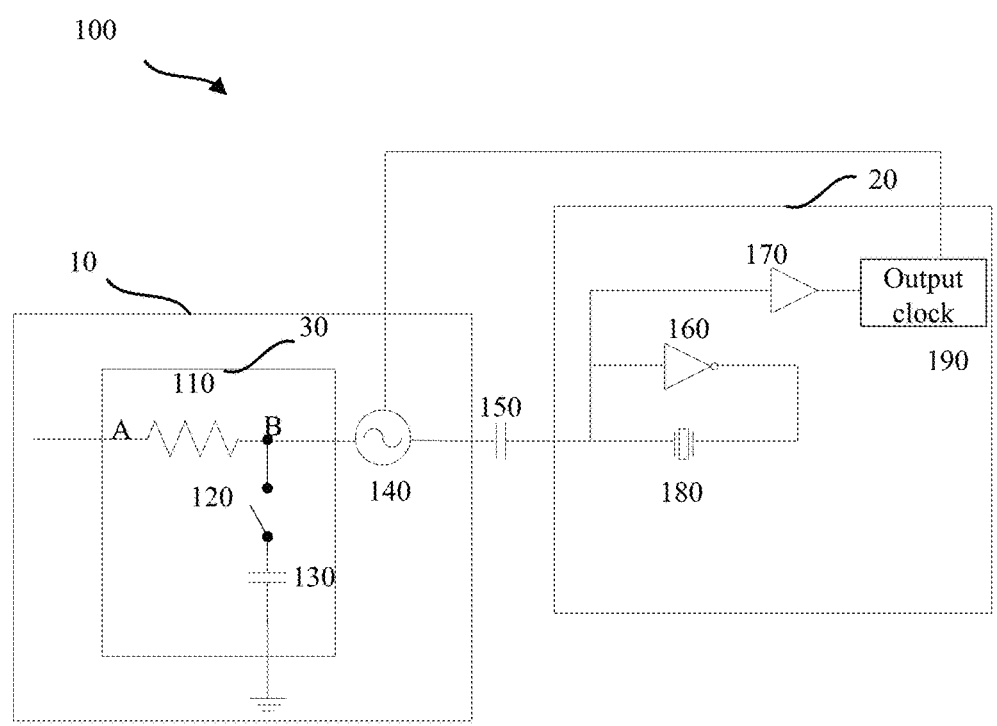
FIG. 1 is a diagram illustrating an embodiment of a crystal oscillation circuit and an exciting circuit according to an embodiment of the invention.

FIG. 1 is a diagram illustrating an embodiment of a crystal oscillation circuit 20 and an exciting circuit 10 according to an embodiment of the invention. In the embodiment, the crystal oscillation circuit 20 comprises a crystal 180, an inverter 160 and a buffer 170. The crystal 180 is connected with the inverter 160 in parallel. The inverter 160 and the crystal 180 are connected to the buffer 170 in series. In practice, the crystal oscillation circuit 20 shown in FIG. 1 is an exemplary circuit. The crystal oscillation circuit 20 can be, for example, a Colpitts oscillation circuit, or a Pierce oscillation circuit, etc. In the embodiment, the exciting circuit 10 comprises a charging circuit 30 and a voltage-controlled oscillator 140. The voltage-controlled oscillator 140 is coupled to the charging circuit 30 and configured to provide an exciting signal to the crystal oscillation circuit 20. In the embodiment, the exciting circuit 10 and the crystal oscillation circuit 20 are connected via a direct current blocking capacitor 150, that is, the direct current blocking capacitor 150 is connected between the voltage-controlled oscillator 140 and the crystal 180. Further, the direct current blocking capacitor 150 is configured to block direct current from the voltage-controlled oscillator 140. Wherein the charging circuit 30 further comprises a resistor 110 and a capacitor 130, and wherein the capacitor 130 is connected in parallel to the resistor 110 via a switch 120. For example, the resistor 110 is 1M ohm and the capacitor 130 is 22 pF and an output voltage of the charging circuit 30, i.e., the voltage of point B ($V_B$) is linear voltage increasing from 0.

In a further embodiment, an output clock 190 is connected between the buffer 170 and the voltage-controlled oscillator 140 and configured to control an oscillation time for the voltage-controlled oscillator 140. Specifically, the clock 190 can command the voltage-controlled oscillator 140 to be powered down after the crystal oscillates normally. In the embodiment, the output clock 190 can count for $2^n$ cycles, and the value of n can be larger than or equal to zero. For example, 32 ($2^5$) cycles and one cycle is 50 ns. After the crystal 180 starts to oscillate, the output clock 190 starts to count, and after the output clock 190 counts for 32 cycles, the voltage-controlled oscillator 140 is powered down. In practice, if the crystal oscillation circuit 20 starts to oscillate quickly, the value of n can be smaller and if the crystal oscillation circuit 20 starts to oscillate slowly, the value of n should be larger.

Figure 2:
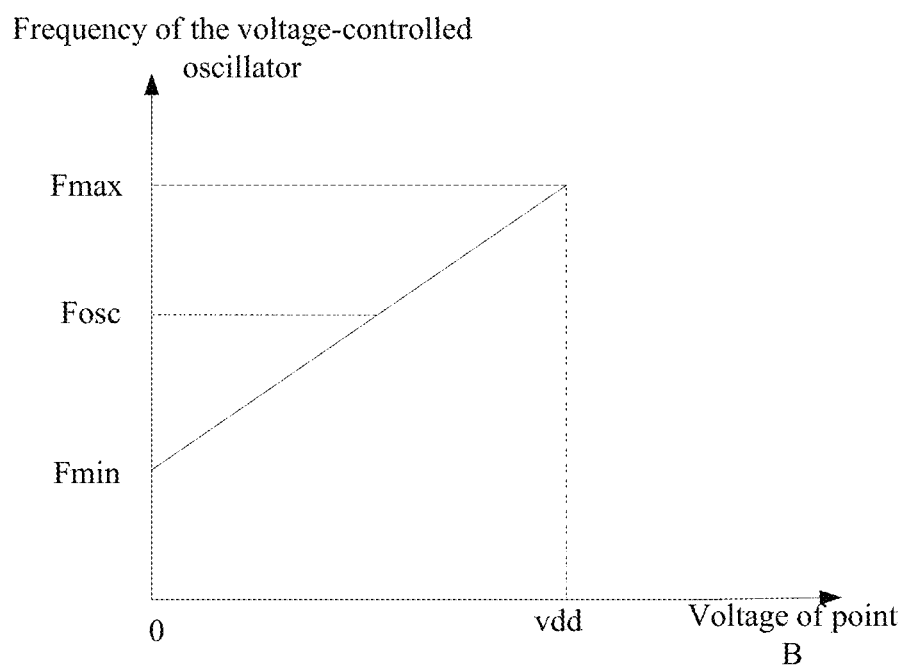
FIG. 2 is a diagram illustrating a function of voltage and frequency for the voltage-controlled oscillator shown in FIG. 1 according to a further embodiment of the invention.

FIG. 2 is a diagram illustrating a function of voltage and frequency for the voltage-controlled oscillator shown in FIG. 1 according to a further embodiment of the invention. After the switch 120 is closed, the charging circuit 30 starts to charge the voltage-controlled oscillator 140. The frequency of the voltage-controlled oscillator 140 varies as the voltage of point B ($V_B$, the point B is shown in FIG. 1) varies. Wherein, the natural frequency of the voltage-controlled oscillator 140 is $f_0$ and the voltage-controlled gain of the voltage-controlled oscillator 140 is $K_{voc}$. The function of voltage and frequency for the voltage-controlled oscillator 140 is $F=f_0+K_{voc}*V_B$, wherein, for example, the $K_{voc}$ is 50 MHz/v. As shown in FIG. 2, the initial value of point B is 0, and the initial value of voltage-controlled oscillator 140 is $F_{min}$, i.e., $f_0$. Then, the switch 120 is closed, the value of point B increases linearly and the value of the voltage-controlled oscillator 140 also increases linearly to a maximum value, i.e., $F_{max}$. Wherein, the natural frequency of the crystal 180 ($F_{osc}$) in the crystal oscillation circuit 20 falls within the range from $F_{min}$ to $F_{max}$. Since the range is large enough, it can cover $F_{osc}$ regardless of different environmental temperature. Thus, it doesn't need to recalibrate the voltage-controlled oscillator 140 even if environmental temperature changes, and thus will not increase the complexity of the circuit design.

Figure 3:
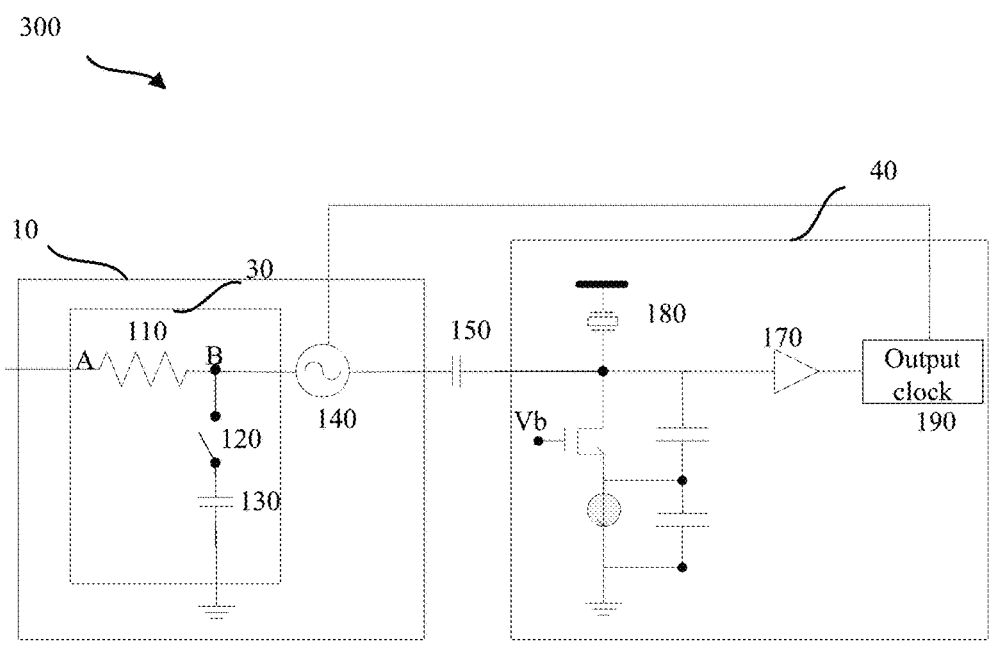
FIG. 3 is a diagram illustrating an embodiment of a crystal oscillation circuit and an exciting circuit according to another embodiment of the invention.

FIG. 3 is a diagram illustrating an embodiment of an exciting circuit 10 and a crystal oscillation circuit 40 according to another embodiment of the invention. The exciting circuit 10 is connected to the crystal oscillation circuit 40 via a direct current blocking capacitor 150. That is, the direct current blocking capacitor 150 is connected between the voltage-controlled oscillator 140 in the exciting circuit 10 and the crystal 180 in the crystal oscillation circuit 40. The crystal oscillation circuit 40 is a Colpitts oscillation circuit. The basic structure of the Colpitts oscillation circuit 40 is similar to the structure of the crystal oscillation circuit 20 shown in FIG. 1. A difference between these two structures is the grounding mode. However, the grounding mode of the crystal oscillation circuit 40 does not affect the operating principle of the crystal oscillation circuit 40, that is, the Colpitts oscillation circuit 40 works similarly to the crystal oscillation circuit 20 shown in FIG. 1. Then the voltage-controlled oscillator 140 in the exciting circuit 10 can excite the crystal 180 in the crystal oscillation circuit 40 as described with respect to FIG. 1 and FIG. 2.

In the embodiment, the output clock 190 in the crystal oscillation circuit 40 is connected between the buffer 170 in the crystal oscillation circuit 40 and the voltage-controlled oscillator 140 and configured to control an oscillation time for the voltage-controlled oscillator 140. Specifically, the clock 190 can command the voltage-controlled oscillator 140 to be powered down after the crystal oscillates normally. In the embodiment, the output clock 190 can count for $2^n$ cycles, and the value of n can be larger than or equal to zero. For example, 32 ($2^5$) cycles and one cycle is 50 ns. After the crystal 180 starts to oscillate, the output clock 190 starts to count, and after the output clock 190 counts for 32 cycles, the voltage-controlled oscillator 140 is powered down. In practice, if the crystal oscillation circuit 40 starts to oscillate quickly, the value of n can be smaller and if the crystal oscillation circuit 40 starts to oscillate slowly, the value of n should be larger.

Also referring to FIG. 2, after the switch in the exciting circuit 10 is closed, the charging circuit 30 in the exciting circuit 10 starts to charge the voltage-controlled oscillator 140. The frequency of the voltage-controlled oscillator 140 varies as the voltage of point B ($V_B$, the point B is shown in FIG. 3) varies. Wherein, the natural frequency of the voltage-controlled oscillator 140 is $f_0$ and the voltage-controlled gain of the voltage-controlled oscillator 140 is $K_{voc}$. The function of voltage and frequency for the voltage-controlled oscillator 140 is $F=f_0+K_{voc}*V_B$, wherein, for example, the $K_{voc}$ is 50 MHz/v. The initial value of point B is 0, and the initial value of voltage-controlled oscillator 140 is $F_{min}$, i.e., $f_0$. Then, the switch 120 is closed, the value of point B increases linearly and the value of the voltage-controlled oscillator 140 also increases linearly to a maximum value, i.e., $F_{max}$. Wherein, the natural frequency of the crystal 180 ($F_{osc}$) in the crystal oscillation circuit 40 falls within the range from $F_{min}$ to $F_{max}$. Since the range is large enough, it can cover $F_{osc}$ regardless of different environmental temperature. Thus, it doesn't need to recalibrate the voltage-controlled oscillator 140 even if environmental temperature changes, and thus will not increase the complexity of the circuit design.

Figure 4:
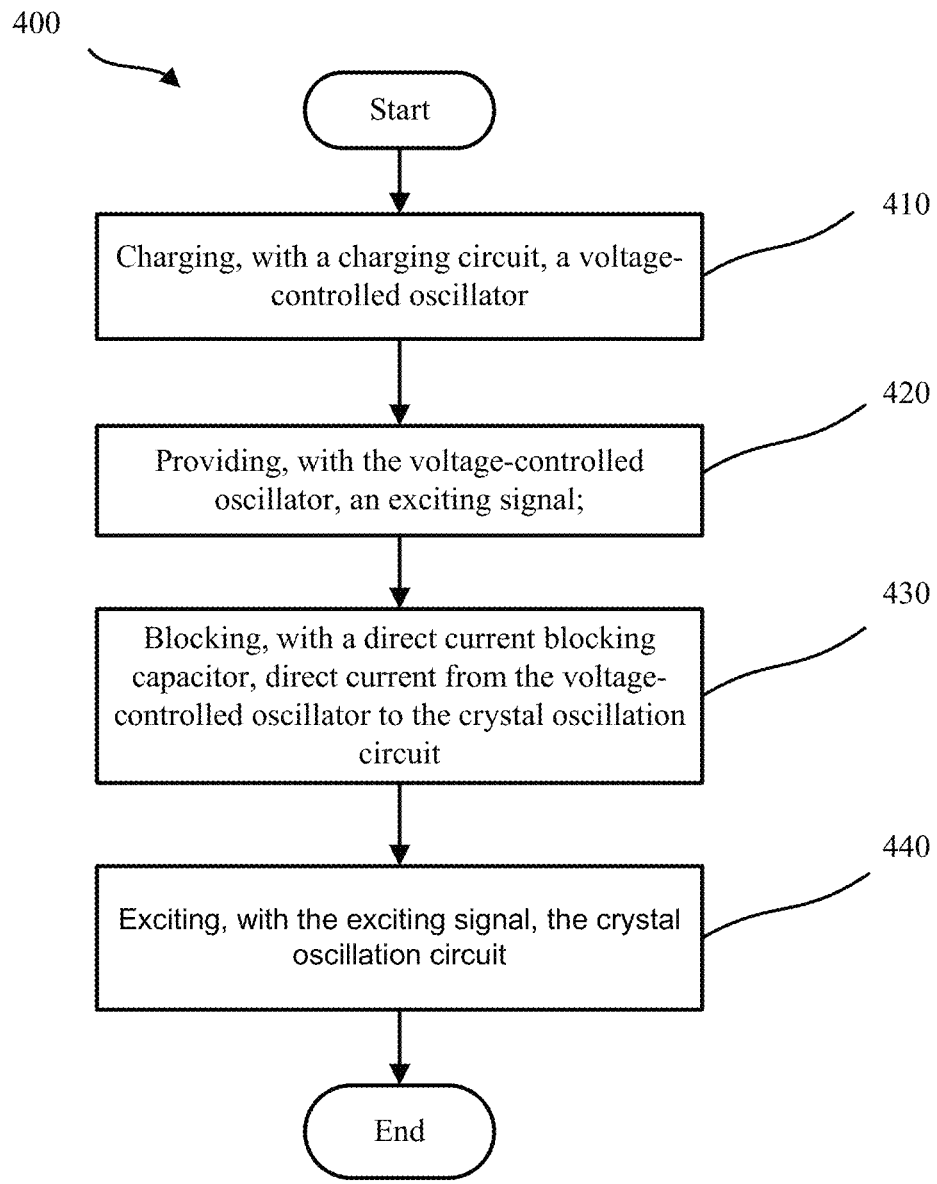
FIG. 4 is a flowchart of a method for exciting the crystal oscillation circuit shown in FIG. 1 or FIG. 2 according to an embodiment of the invention.

FIG. 4 is a flowchart of a method 400 for exciting the crystal oscillation circuit shown in FIG. 1 or FIG. 3 according to an embodiment of the invention. The method 400 for exciting a crystal oscillation circuit comprises: charging, in block 410, with a charging circuit, a voltage-controlled oscillator; providing, in block 420, with the voltage-controlled oscillator, an exciting signal; blocking, in block 430, with a direct current blocking capacitor, direct current from the voltage-controlled oscillator to the crystal oscillation circuit; exciting, in block 440, with the exciting signal, the crystal oscillation circuit.

In the embodiment, the charging circuit further comprise a resistor and a capacitor, and wherein the capacitor is connected in parallel to the resistor via a switch. For example, the resistor is 1M ohm and the capacitor C2 is 22 pF and an output voltage of the charging circuit is linear voltage increasing from 0.

Alternatively, the frequency of the voltage-controlled oscillator varies with the output voltage of the charging circuit and an oscillation frequency of the crystal oscillation circuit falls within a frequency range from a minimum frequency of the voltage controlled oscillator ($F_{min}$) to a maximum frequency of the voltage controlled oscillator ($F_{max}$). Wherein, the natural frequency of the voltage-controlled oscillator is $f_0$ and the voltage-controlled gain of the voltage-controlled oscillator is $K_{voc}$. The function of voltage and frequency for the voltage-controlled oscillator is $F=f_0+K_{voc}*V_B$, wherein, for example, the $K_{voc}$ is 50 MHz/v. The initial value of point B (see the point B in FIG. 1) is 0, and the initial value of voltage-controlled oscillator is $F_{min}$, i.e., $f_0$. Then, as the value of point B increases linearly, the value of the voltage-controlled oscillator also increases linearly to a maximum value, i.e., $F_{max}$. Wherein, the natural frequency of the crystal ($F_{osc}$) in the crystal oscillation circuit falls within the range from $F_{min}$ to $F_{max}$ Since the range is large enough, it can cover $F_{osc}$ regardless of different environmental temperature. Thus, it doesn't need to recalibrate the voltage-controlled oscillator even if environmental temperature changes, and thus will not increase the complexity of the circuit design.

Alternatively, the crystal oscillation circuit further comprises an output clock connected between the buffer and the voltage-controlled oscillator and configured to control an oscillation time for the voltage-controlled oscillator. Specifically, the clock can command the voltage-controlled oscillator to be powered down after the crystal oscillates normally. In the embodiment, the output clock can count for $2^n$ cycles, for example, 32 ($2^5$) cycles and one cycle is 50 ns. After the crystal starts to oscillate, the output clock starts to count, and after the output clock counts for 32 cycles, the voltage-controlled oscillator is powered down.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural components that do not differ from the literal language of the claims, or if they include equivalent structural components with insubstantial differences from the literal languages of the claims.

What is claimed is:

1. A method for exciting a crystal oscillation circuit, comprising:
   charging, with a charging circuit, a voltage-controlled oscillator;
   providing, with the voltage-controlled oscillator, an exciting signal;
   blocking, with a direct current blocking capacitor, direct current from the voltage-controlled oscillator to the crystal oscillation circuit; and
   exciting, with the exciting signal, the crystal oscillation circuit, wherein the crystal oscillation circuit is external to the voltage-controlled oscillator.

2. The method of claim 1, wherein the charging circuit further comprises a resistor and a capacitor, and wherein the capacitor is connected in parallel to the resistor via a switch.

3. The method of claim 2, wherein an output voltage of the charging circuit is linear voltage increasing from 0.

4. The method of claim 3, wherein frequency of the voltage-controlled oscillator varying with the output voltage of the charging circuit and an oscillation frequency of the crystal oscillation circuit falls within a frequency range from a minimum frequency of the voltage controlled oscillator to a maximum frequency of the voltage controlled oscillator.

5. The method of claim 1, wherein the crystal oscillation circuit further comprises an output clock connected to the voltage-controlled oscillator and configured to control an oscillation time for the voltage-controlled oscillator.

6. A circuit for exciting a crystal oscillation circuit, comprising:
   a charging circuit;
   a voltage-controlled oscillator coupled to the charging circuit and configured to provide an exciting signal to the crystal oscillation circuit; and
   a direct current blocking capacitor connected between the voltage-controlled oscillator and the crystal oscillation circuit and configured to block direct current from the voltage-controlled oscillator, wherein the crystal oscillation circuit is external to the voltage-controlled oscillator.

7. The circuit of claim 6, wherein the charging circuit further comprises a resistor and a capacitor, and wherein the capacitor is connected in parallel to the resistor via a switch.

8. The circuit of claim 7, wherein an output voltage of the charging circuit is linear voltage increasing from 0.

9. The circuit of claim 8, wherein frequency of the voltage-controlled oscillator varying with the output voltage of the charging circuit and an oscillation frequency of the crystal oscillation circuit falls within a frequency range from a minimum frequency of the voltage controlled oscillator to a maximum frequency of the voltage controlled oscillator.

10. The circuit of claim 6, wherein the crystal oscillation circuit further comprises an output clock connected to the voltage-controlled oscillator and configured to control an oscillation time for the voltage-controlled oscillator.

* * * * *